(12) United States Patent
Saiki et al.

(10) Patent No.: US 9,184,082 B2
(45) Date of Patent: Nov. 10, 2015

(54) ADHESIVE COMPOSITION, ADHESIVE SHEET AND PRODUCTION PROCESS FOR SEMICONDUCTOR DEVICE

(75) Inventors: Naoya Saiki, Tokyo (JP); Isao Ichikawa, Tokyo (JP); Hironori Shizuhata, Tokyo (JP); Osamu Yamazaki, Tokyo (JP)

(73) Assignee: Lintec Corporation, Tokyo (JP)

( * ) Notice: Subject to any disclaimer, the term of this patent is extended or adjusted under 35 U.S.C. 154(b) by 562 days.

(21) Appl. No.: 11/945,769

(22) Filed: Nov. 27, 2007

(65) Prior Publication Data

US 2008/0124839 A1 May 29, 2008

(30) Foreign Application Priority Data

Nov. 27, 2006 (JP) .................. 2006-319230
Nov. 27, 2006 (JP) .................. 2006-319231

(51) Int. Cl.
| | | |
|---|---|---|
| H01L 21/50 | (2006.01) | |
| C09J 163/10 | (2006.01) | |
| C08K 5/07 | (2006.01) | |
| C08K 5/103 | (2006.01) | |
| C08K 5/29 | (2006.01) | |
| C08L 33/08 | (2006.01) | |
| C08L 63/10 | (2006.01) | |
| H01L 21/683 | (2006.01) | |
| C08K 5/00 | (2006.01) | |
| C09J 133/08 | (2006.01) | |
| H01L 23/495 | (2006.01) | |
| H01L 23/00 | (2006.01) | |
| C08L 63/00 | (2006.01) | |

(52) U.S. Cl.
CPC .......... *H01L 21/6836* (2013.01); *C08K 5/0025* (2013.01); *C08K 5/07* (2013.01); *C08K 5/103* (2013.01); *C08K 5/29* (2013.01); *C08L 33/08* (2013.01); *C08L 63/10* (2013.01); *C09J 133/08* (2013.01); *C09J 163/10* (2013.01); *H01L 23/49513* (2013.01); *H01L 24/27* (2013.01); *H01L 24/31* (2013.01); *H01L 24/83* (2013.01); *C08L 63/00* (2013.01); *C08L 2205/03* (2013.01); *C09J 2203/326* (2013.01); *C09J 2205/102* (2013.01); *C09J 2433/00* (2013.01); *C09J 2461/00* (2013.01); *C09J 2463/00* (2013.01); *H01L 2221/68327* (2013.01); *H01L 2224/274* (2013.01); *H01L 2224/2919* (2013.01); *H01L 2224/83191* (2013.01); *H01L 2224/83855* (2013.01); *H01L 2924/0102* (2013.01); *H01L 2924/014* (2013.01); *H01L 2924/01005* (2013.01); *H01L 2924/01006* (2013.01); *H01L 2924/01019* (2013.01); *H01L 2924/01025* (2013.01); *H01L 2924/01027* (2013.01); *H01L 2924/01029* (2013.01); *H01L 2924/01033* (2013.01); *H01L 2924/01045* (2013.01); *H01L 2924/01077* (2013.01); *H01L 2924/01082* (2013.01); *H01L 2924/0665* (2013.01); *H01L 2924/07802* (2013.01); *H01L 2924/09701* (2013.01); *H01L 2924/10329* (2013.01); *H01L 2924/12044* (2013.01); *H01L 2924/14* (2013.01); *Y10T 428/287* (2015.01); *Y10T 428/2809* (2015.01); *Y10T 428/2813* (2015.01); *Y10T 428/2891* (2015.01)

(58) Field of Classification Search
CPC ...................................................... C09J 163/10
See application file for complete search history.

(56) References Cited

U.S. PATENT DOCUMENTS

| | | | |
|---|---|---|---|
| 5,001,174 A * | 3/1991 | Yanagisawa et al. ......... 523/443 |
| 5,110,388 A | 5/1992 | Komiyama et al. | |
| 5,118,567 A | 6/1992 | Komiyama et al. | |
| 5,290,882 A * | 3/1994 | Shiobara et al. .............. 525/502 |
| 5,356,949 A | 10/1994 | Komiyama et al. | |
| 6,187,340 B1 * | 2/2001 | Fukuta et al. .................. 424/474 |
| 6,277,481 B1 | 8/2001 | Sugino et al. | |
| 6,645,617 B1 * | 11/2003 | Okazaki et al. ............... 428/343 |
| 6,673,441 B1 | 1/2004 | Tanaka et al. | |
| 7,070,670 B2 * | 7/2006 | Tomiyama et al. ........... 156/248 |
| 7,262,514 B2 | 8/2007 | Yoshikawa et al. | |
| 2007/0026572 A1 | 2/2007 | Hatakeyama et al. | |
| 2007/0036971 A1 | 2/2007 | Inada et al. | |
| 2007/0096056 A1 * | 5/2007 | Takeuchi et al. ......... 252/299.01 |
| 2007/0137782 A1 | 6/2007 | Matsumura et al. | |
| 2007/0238802 A1 | 10/2007 | Harada et al. | |
| 2007/0241436 A1 | 10/2007 | Ookubo et al. | |
| 2008/0064792 A1 * | 3/2008 | Hwang et al. .................. 523/466 |
| 2009/0005480 A1 | 1/2009 | Nakamura et al. | |
| 2009/0186955 A1 | 7/2009 | Inada et al. | |
| 2009/0253876 A1 * | 10/2009 | Funaya et al. ................. 526/128 |

FOREIGN PATENT DOCUMENTS

| | | |
|---|---|---|
| JP | 2032181 A | 2/1990 |
| JP | 8239636 A | 9/1996 |
| JP | 10008001 A | 1/1998 |
| JP | 2000017246 A | 1/2000 |

(Continued)

OTHER PUBLICATIONS

Human translation JP 2004-253476A (2004).*

(Continued)

*Primary Examiner* — Frank D Ducheneaux
(74) *Attorney, Agent, or Firm* — The Webb Law Firm

(57) ABSTRACT

An adhesive composition including an acrylic polymer, an epoxy thermosetting resin having an unsaturated hydrocarbon group and a thermosetting agent. Also provided is an adhesive sheet having an adhesive layer including the above-mentioned adhesive composition.

14 Claims, No Drawings

(56) References Cited

FOREIGN PATENT DOCUMENTS

| | | | |
|---|---|---|---|
| JP | 2001011411 A | | 1/2001 |
| JP | 2002012819 A | | 1/2002 |
| JP | 2002194061 A | | 7/2002 |
| JP | 2002302531 A | | 10/2002 |
| JP | 2004043667 A | | 2/2004 |
| JP | 2004253476 A | * | 9/2004 |
| JP | 2005167176 A | | 6/2005 |
| JP | 2005222037 A | * | 8/2005 |
| JP | 2006335860 A | | 12/2006 |
| JP | 2008111092 A | | 5/2008 |
| WO | WO 2005052021 A1 | * | 6/2005 |

OTHER PUBLICATIONS

Machine translation of JP 2005-222037 A (2005).*
CAS registry No. 112755-07-4 for MEH 7500 or 7500-3S phenol-salicylaldehyde copolymer, 2009, one page.

* cited by examiner

US 9,184,082 B2

ADHESIVE COMPOSITION, ADHESIVE SHEET AND PRODUCTION PROCESS FOR SEMICONDUCTOR DEVICE

BACKGROUND OF THE INVENTION

1. Field of the Invention

The present invention relates to an adhesive composition which is particularly suited for using at a step of die-bonding a semiconductor device (semiconductor chip) on an organic substrate and a lead frame and a step of dicing a silicon wafer and the like and die-bonding a semiconductor chip on an organic substrate and a lead frame, an adhesive sheet having an adhesive layer comprising the above adhesive composition and a production process for a semiconductor device using the above adhesive sheet.

2. Description of the Related Art

A semiconductor wafer of silicon, gallium arsenide or the like is produced in a large size, and this wafer is cut and separated (dicing) into small pieces (IC chips) of devices and then transferred to a mounting step which is a subsequent step. In this case, the semiconductor wafer is subjected to the respective steps of dicing, washing, drying, expanding and picking-up in the state that it is adhered in advance on an adhesive sheet, and then it is transferred to a bonding step which is a subsequent step.

In order to simplify the picking-up step and the bonding step among the above steps, various adhesive sheets for dicing and die-bonding which are provided with both a wafer-fixing function and a die-adhering function are proposed (for examples, patent documents 1 to 4).

Adhesive sheets comprising an adhesive layer comprising a specific composition and a base material are disclosed in the patent documents 1 to 4. The above adhesive layer has a function of fixing a wafer in dicing the wafer, and irradiation thereof with an energy beam reduces an adhesive strength thereof and makes it possible to control the adhesive strength between the adhesive layer and the base material, so that when picking up the chip after finishing dicing, the adhesive layer is peeled off together with the chip. When the IC chip provided with the adhesive layer is mounted on a substrate and heated, an adhesive strength of a thermosetting resin contained in the adhesive layer is revealed to complete adhesion between the IC chip and the substrate.

The adhesive sheets disclosed in the patent documents described above enables so-called direct die-bonding and makes it possible to omit a step of coating an adhesive for adhering a die. The adhesives disclosed in the patent documents described above are blended with an energy beam-curable compound having a low molecular weight as an energy beam-curable component. Irradiation with an energy beam polymerizes and cures the energy beam-curable compound to reduce an adhesive strength thereof and makes it easy to peel off the adhesive layer from the base material. In the adhesive layer of the adhesive sheet described above, all the components are cured after die-bonding passing through curing by an energy beam and thermal curing, whereby it adheres the chip firmly on the substrate.

On the other hand, very severe physical properties are required to semiconductor devices in recent years. For example, package reliability under severe hot and humid environment is required. However, a reduction in a thickness of a semiconductor chip itself results in a reduction in a strength of the chip, and the package reliability under severe hot and humid environment has not necessarily been satisfactory.

In the adhesives disclosed in the patent documents described above, the energy beam-curable compound having a low molecular weight is used as an energy beam-curable component, and such energy beam-curable compound having a low molecular weight is liable to bring about interfacial breakage under hot and humid environment due to the short shearing strength depending on the blending proportion thereof, the dispersion state or the curing conditions to reduce an adhesive property between the chip and an adherend such as a printed wiring board. This has made it impossible in a certain case to allow a semiconductor package which is becoming severer to satisfy a required level in reliability.

In a surface mounting method carried out in connection of electronic parts in recent years, a surface mounting method (reflow) in which the whole part of a package is exposed to high temperature of not lower than a melting point of a solder is carried out. In recent years, a mounting temperature is elevated from 240° C. which has so far been carried out to 260° C. due to transfer to a solder containing no lead from the viewpoint of attentions to the environment to increase a stress produced in the inside of a semiconductor package, and the risk of producing package crack is further elevated.

That is, a reduction in a thickness of a semiconductor chip and a rise in amounting temperature bring about a reduction in a reliability of a package.

Patent document 1: JP-A-1990-32181
Patent document 2: JP-A-1996-239636
Patent document 3: JP-A-1998-8001
Patent document 4: JP-A-2000-17246

SUMMARY OF THE INVENTION

Accordingly, it is required to actualize a high package reliability in a package in which a semiconductor chip being reduced in a thickness is mounted even when exposed to severe reflow conditions.

The present invention has been made in light of the conventional arts described above, and an object thereof is to investigate an adhesive used for die-bonding and meet the requirements described above.

The present invention having an object of solving the above problems comprises the following essentials.

(1) An adhesive composition comprising an acrylic polymer, an epoxy thermosetting resin having an unsaturated hydrocarbon group and a thermosetting agent.
(2) The adhesive composition as described in the (1), wherein the epoxy thermosetting resin having an unsaturated hydrocarbon group is a resin having an aromatic ring.
(3) The adhesive composition as described in the (1), further comprising a photopolymerization initiator.
(4) The adhesive composition as described in the (3), wherein the epoxy thermosetting resin having an unsaturated hydrocarbon group is a resin having an aromatic ring.
(5) An adhesive sheet comprising a base material and, formed thereon, an adhesive layer comprising the adhesive composition as described in the (1).
(6) An adhesive sheet comprising a base material and, formed thereon, an adhesive layer comprising the adhesive composition as described in the (2).
(7) An adhesive sheet comprising a base material and, formed thereon, an adhesive layer comprising the adhesive composition as described in the (3).
(8) An adhesive sheet comprising a base material and, formed thereon, an adhesive layer comprising the adhesive composition as described in the (4).
(9) A production process for a semiconductor device, comprising:

a step of adhering a semiconductor wafer on the adhesive layer of the adhesive sheet as described in the (5), dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer.

(10) A production process for a semiconductor device, comprising:

a step of adhering a semiconductor wafer on the adhesive layer of the adhesive sheet as described in the (6), dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer.

(11) A production process for a semiconductor device, comprising:

a step of adhering a semiconductor wafer on the adhesive layer of the adhesive sheet as described in the (7), dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer and a step of irradiating the adhesive layer with an energy beam at any stage of after adhering the semiconductor wafer and before separating the IC chip.

(12) A production process for a semiconductor device, comprising:

a step of adhering a semiconductor wafer on the adhesive layer of the adhesive sheet as described in the (8), dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer and a step of irradiating the adhesive layer with an energy beam at any stage of after adhering the semiconductor wafer and before separating the IC chip.

According to the present invention, provided are an adhesive composition which can achieve a high package reliability in a package in which a semiconductor chip being reduced in a thickness is mounted even when exposed to severe reflow conditions, an adhesive sheet having an adhesive layer comprising the above adhesive composition and a production process for a semiconductor device using the above adhesive sheet.

DETAILED DESCRIPTION OF THE INVENTION

The present invention shall more specifically be explained below.

The adhesive composition (hereinafter also referred to merely as "the adhesive") according to the present invention comprises as essential components, an acrylic polymer (A) (hereinafter referred to as "the compound (A)", the same is true for the other components), an epoxy thermosetting resin (B) having an unsaturated hydrocarbon group (hereinafter referred to as "the compound (B)" or "component (B)") and a thermosetting agent (D), and it may comprise, if necessary, other components in order to improve a variety of the physical properties. The each component shall specifically be explained below.

(A) Acrylic Polymer:

Acrylic polymers which have been publicly known are used as the acrylic polymer. The acrylic polymer has a weight average molecular weight of preferably 10,000 or more and 2,000,000 or less, more preferably 100,000 or more and 1,500,000 or less. If the acrylic polymer has a too low weight average molecular weight, the adhesive strength with the base material is high, and inferior picking-up is caused in a certain case. On the other hand, if it exceeds 2,000,000, the adhesive layer can not follow irregularities on the substrate in a certain case, and it is the cause of bringing about voids. The acrylic polymer has a glass transition temperature falling in a range of preferably −10° C. or higher and 50° C. or lower, more preferably 0° C. or higher and 40° C. or lower and particularly preferably 0° C. or higher and 30° C. or lower. If the glass transition temperature is too low, a peeling strength between the adhesive layer and the base material is increased, and inferior picking-up is caused in a certain case. On the other hand, if it is too high, the adhesive strength for fixing a wafer is likely to be unsatisfactory.

Examples of a monomer for the acrylic polymer include (meth)acrylic esters and derivatives thereof. Examples thereof include alkyl(meth)acrylates in which an alkyl group has 1 to 18 carbon atoms such as methyl(meth)acrylate, ethyl (meth)acrylate, propyl(meth)acrylate, and butyl(meth)acrylate; (meth)acrylic esters having a cyclic skeleton such as cycloalkyl(meth)acrylate, benzyl(meth)acrylate, isobornyl acrylate, dicyclopentanyl acrylate, dicyclopentenyl acrylate, dicyclopentenyl oxyethyl acrylate and imido acrylate; and 2-hydroxyethyl acrylate, 2-hydroxyethyl methacrylate, 2-hydroxypropyl acrylate, 2-hydroxypropyl methacrylate, acrylic acid, methacrylic acid, itaconic acid, glycidyl methacrylate and glycidyl acrylate. Further, it may be copolymerized with vinyl acetate, acrylonitrile, styrene and the like. The acrylic polymer having a hydroxyl group is preferred from the viewpoint of good compatibility with epoxy resin.

(B) Epoxy Thermosetting Resin Having an Unsaturated Hydrocarbon Group:

The compound (B) has an unsaturated hydrocarbon group and epoxy group in one molecule. Since the compound (B) has the unsaturated hydrocarbon group, it has high compatibility with the acrylic polymer (A) compared to the epoxy thermosetting resin having no unsaturated hydrocarbon group. Therefore, the adhesive composition of the present invention has more enhanced reliability than the adhesive composition containing only the epoxy thermosetting resin having no unsaturated hydrocarbon group as the epoxy thermosetting resin.

The unsaturated hydrocarbon group is preferably curable by irradiation with energy beam and more preferably curable by irradiation with ultraviolet. Specific examples of the unsaturated hydrocarbon group include a vinyl group, an allyl group, an acryloyl group, a methacryloyl group, an acryl amide group, and a methacryl amide group, and preferable examples include an acryloyl group.

A resin having an aromatic ring is preferable for the compound (B), since it enhances strength and heat resistance after the thermal setting of the adhesive.

Examples of the compound (B) include a compound in which some epoxy groups of a polyfunctional epoxy thermosetting resin is converted into a group containing an unsaturated hydrocarbon group. Such compound can be obtained by the addition reaction of acrylic acid to the epoxy group. Examples of the compound (B) also include a compound in which a group containing an unsaturated hydrocarbon group is directly bound to an aromatic ring or the like constituting the epoxy thermosetting resin.

Examples of the compound (B) include a compound (following Formula (1)) obtained through the addition reaction of acrylic acid to some epoxy groups of bisphenol A diglycidyl ether, a compound (following Formula (2)) obtained through the addition reaction of acrylic acid to some epoxy groups of cresol novolak epoxy resin, or a compound obtained through the addition reaction of acrylic acid to some epoxy groups of an epoxy thermosetting resin (C) described later.

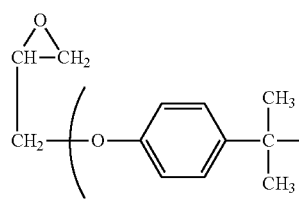

(wherein R is H— or CH₃—, and n is an integer of 0 to 10)

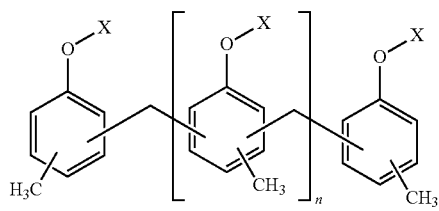

(wherein X is

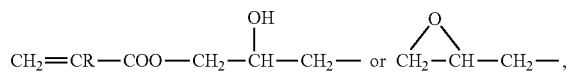

R is H— or CH₃—, and n is an integer of 0 to 10).

Although the compound obtained through the reaction between an epoxy compound and acrylic acid is sometimes a mixture thereof with an unreacted substance or a compound in which epoxy groups are totally consumed, in the present invention, the mixture has only to substantially contain the above-mentioned compound.

The number average molecular weight of the compound (B) is not particularly limited, but from the viewpoint of the curing property of the adhesive, or strength or heat resistance after the curing, it is preferably 300 to 30,000, more preferably 400 to 10,000, and still more preferably 500 to 3,000. The content of the unsaturated group in the compound (B) is 0.1 to 1,000 mol, more preferably 1 to 500 mol, and still more preferably 10 to 400 mol with respect to 100 mol of epoxy groups in the compound (B) When the content is 0.1 mol or less, the effect of enhancing the package reliability cannot be provided in a certain case. When the content is 1,000 mol or more, thermosetting property is insufficient in a certain case.

(C) Epoxy Thermosetting Resin:

The epoxy thermosetting resin (C) (hereinafter also referred to as "epoxy resin (C)") can be used, together with the compound (B), for adjusting the adhesiveness and curing property of the adhesive composition of the present invention.

Examples of the epoxy resin (C) include epoxy compounds having two or more functional groups such as bisphenol A diglycidyl ether and hydrogenated compounds thereof, ortho-cresol novolak epoxy resins (the following Formula (3)) dicyclopentadiene type epoxy resins (the following Formula (4)), biphenyl type epoxy resins or biphenyl compounds (the following Formulae (5) and (6)) and the like. They can be used alone or in combination of two or more kinds thereof.

The total amount of use of the compound (B) and the epoxy resin (C) is preferably 1 to 1,500 parts by weight, and more preferably 3 to 1,000 parts by weight with respect to 100 parts by weight of the acrylic polymer (A). When the amount is less than 1 part by weight, the satisfactory adhesiveness is not obtained in a certain case. On the other hand, when it exceeds 1,500 parts by weight, the peeling strength from the base material grows high, and inferior picking up is brought about in a certain case.

The content of the epoxy resin (C) is preferably 1 to 1,000 parts by weight, more preferably 10 to 500 parts by weight, and further more preferably 20 to 200 parts by weight, with respect to 100 parts by weight of the compound (B).

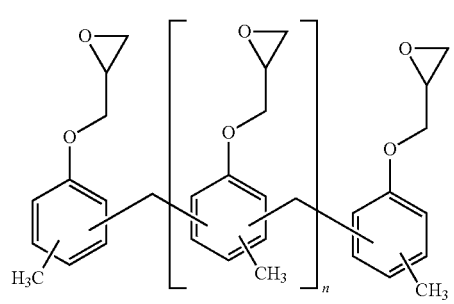

(wherein n represents an integer of 0 or more),

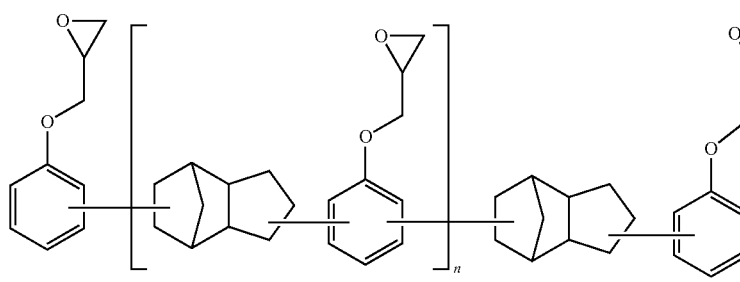

(wherein n represents an integer of 0 or more),

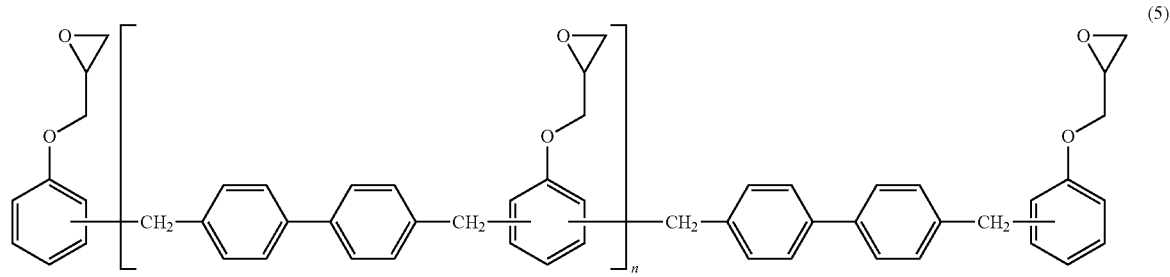

(wherein n represents an integer of 0 or more),

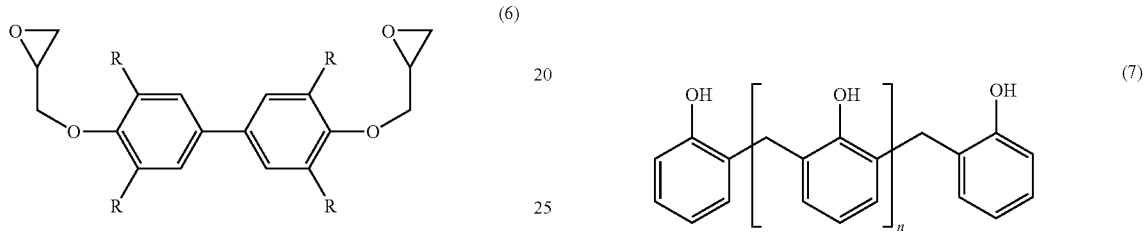

(wherein R represents a hydrogen atom or a methyl group).

(D) Thermosetting Agent:

Examples of the thermosetting agent (D) include compounds having two or more functional groups which can react with an epoxy group, and examples of the functional group include a phenolic hydroxyl group, an alcoholic hydroxyl group, an amino group, a carboxyl group and an acid anhydride group. Among the above groups, a phenolic hydroxyl group, an amino group and an acid anhydride group are preferable, and a phenolic hydroxyl group and an amino group are more preferable. The specific examples of the thermosetting agent (D) include phenolic thermosetting agents such as a novolak type phenol resin represented by the following Formula (7), a dicyclopentadiene phenol resin represented by the following Formula (8), a multifunctional phenol resin represented by the following Formula (9) and a xylok type phenol resin represented by the following Formula (10) and amine thermosetting agents such as DICY (dicyanediamide). The above thermosetting agents can be used alone or in a mixture of two or more kinds thereof.

A use amount of the thermosetting agent (D) is preferably 0.1 to 500 parts by weight, more preferably 1 to 200 parts by weight with respect to 100 parts by weight of the compound (B) and the epoxy resin (C).

If a total amount of the thermosetting agent (D) is too small, the adhesiveness is not obtained in a certain case due to poor curing, and if it is excessive, the moisture absorptivity grows high to reduce a reliability of the package in a certain case.

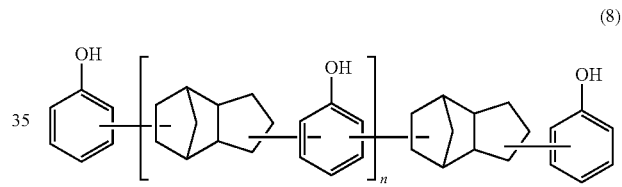

(wherein n represents an integer of 0 or more),

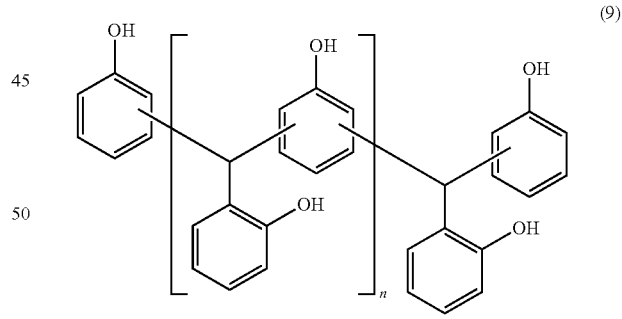

(wherein n represents an integer of 0 or more),

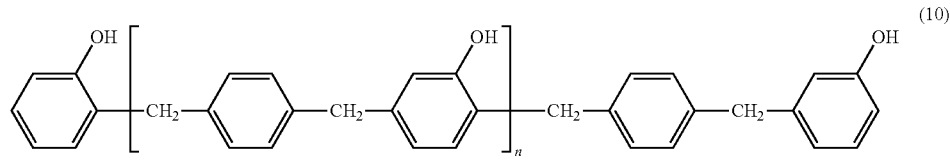

(wherein n represents an integer of 0 or more).

(wherein n represents an integer of 0 or more).

The adhesive composition according to the present invention comprises the acrylic polymer (A), the compound (B) and thermosetting agent (D) as essential components, and it may further comprise, if necessary, the component (C) or the following components in order to improve a variety of the physical properties.

(E) Photopolymerization Initiator:

In using the adhesive composition of the present invention, it may be irradiated with an energy beam such as a UV ray to reduce an adhesive strength thereof to the base material. In this case, addition of a photopolymerization initiator (E) to the above composition makes it possible to reduce the polymerization and curing time and the beam irradiation dose (energy beam irradiation dose).

Specific examples of the photopolymerization initiator include benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxanthone, α-hydroxycyclohexyl phenyl ketone, benzyl diphenyl sulfide, tetramethylthiuram monosulfide, azobisisobutyronitrile, and β-chloroanthraquinone. The photopolymerization initiator (E) can be used alone or in combination of two or more kinds thereof.

A blending proportion of the photopolymerization initiator (E) has to be determined, to be theoretical, based on an amount of an unsaturated bond present in the adhesive, a reactivity thereof and a reactivity of the photopolymerization initiator used, but it is not necessarily easy in a complicated mixture system. When using the photopolymerization initiator (E), it is added as a general guideline in an amount of preferably 0.1 to 10 parts by weight, more preferably 1 to 5 parts by weight with respect to 100 parts by weight of the compound (B) and the later-described energy beam-polymerized compound (J). If the content falls in the range described above, the satisfactory picking-up property is obtained. If it exceeds 10 parts by weight, residues which do not contribute to the photopolymerization are produced, and a curing property of the adhesive is unsatisfactory in a certain case.

(F) Curing Accelerating Agent:

The curing accelerating agent (F) is used in order to adjust a curing speed of the adhesive composition. Examples of the preferred curing accelerating agent include compounds which can accelerate reaction of an epoxy group with a phenolic hydroxy group, amines and the like and, to be specific, tertiary amines such as triethylenediamine, benzyldimethylamine, triethanolamine, dimethylaminoethanol and tris(dimethylaminomethyl)phenol, imidazoles such as 2-methylimidazole, 2-phenylimidazole and 2-phenyl-4-methylimidazole, organic phosphines such as tributylphosphine, diphenylphosphine and triphenylphosphine and tetraphenylboron salts such as tetraphenylphosphonium tetraphenylborate and triphenylphosphine tetraphenylborate. They can be used alone or in a mixture of two or more kinds thereof.

The curing accelerating agent (F) is used in an amount of preferably 0.001 to 100 parts by weight, more preferably 0.01 to 50 parts by weight and still more preferably 0.1 to 10 parts by weight with respect to 100 parts by weight of the compound (B) and the epoxy resin (C).

(G) Coupling Agent:

A coupling agent is used in order to enhance an adhesion of the adhesive composition to an adherend. Use of the coupling agent makes it possible to improve a water resistance of a cured product obtained by curing the adhesive composition without damaging a heat resistance of the cured product. Compounds having groups which react with functional groups present in the component (A), the component (B), the component (C) and the component (D) are preferably used as the coupling agent. The coupling agent is preferably a silane coupling agent. Examples of the above coupling agent include γ-glycidoxypropyltrimethoxysilane, γ-glycidoxypropylmethyldiethoxysilane, β-(3,4-epoxycyclohexyl)ethyltrimethoxysilane, γ-(methacryloproyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane and imidazolesilane. They can be used alone or in a mixture of two or more kinds thereof.

When using the above coupling agent, it is used in a proportion of usually 0.1 to 20 parts by weight, preferably 0.2 to 10 parts by weight and more preferably 0.3 to 5 parts by weight with respect to 100 parts by weight of the compound (B) and the epoxy thermosetting resin (C). When it is less than 0.1 part by weight, the effects might not be obtained, and when it exceeds 20 parts by weight, outgas might occur.

(H) Cross-Linking Agent:

A cross-linking agent can be added in order to control an initial adhesive strength and a cohesion of the adhesive composition. The cross-linking agent includes organic polyvalent isocyanate compounds and organic polyvalent imine compounds.

Examples of the organic polyvalent isocyanate compounds include aromatic polyvalent isocyanate compounds, aliphatic polyvalent isocyanate compounds, and alicyclic polyvalent isocyanate compounds. More specific examples of the organic polyvalent isocyanate compounds include 2,4-tolylenediisocyanate, 2,6-tolylenediisocyanate, 1,3-xylylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2,4'-diisocyanate and lysineisocyanate.

Examples of the organic polyvalent isocyanate compounds also include trimers of the above polyvalent isocyanate compounds and end isocyanate urethane prepolymers obtained by reacting the above polyvalent isocyanate compounds with polyol compounds.

Specific examples of the organic imine isocyanate compounds include N,N'-diphenylmethane-4,4'-bis(1-aziridinecarboxyamide), trimethylolpropane-tri-β-aziridinyl propionate, tetramethylolmethane-tri-β-aziridinyl propionate and N,N'-toluene-2,4-bis(1-aziridinecarboxyamide)triethylenemelamine.

The cross-linking agent (H) is used in a proportion of usually 0.01 to 10 parts by weight, preferably 0.1 to 5 parts by weight and more preferably 0.5 to 3 parts by weight with respect to 100 parts by weight of the acrylic polymer (A).

(I) Inorganic Filler:

Blending of the adhesive with an inorganic filler makes it possible to control the thermal expansion coefficient, and optimization of a thermal expansion coefficient of the adhesive layer after cured to a semiconductor chip having a thermal expansion coefficient different from a thermal expansion coefficient of a substrate made of a metal or organic resin makes it possible to enhance a heat resistance of the package. Further, a moisture absorptivity of the adhesive layer after cured can be reduced. Examples of the preferred inorganic filler include powders of silica, alumina, talc, calcium carbonate, titan white, red iron oxide, silicon carbide, boron nitride and the like, beads obtained by sphering the above compounds, monocrystalline fibers, glass fibers and the like. They can be used alone or in mixture of two or more kinds thereof. In the present invention, among them, silica powder and alumina powder are preferably used.

The amount of the inorganic filler can be controlled in a range of usually 0 to 80% by weight based on the whole adhesive composition of the present invention.

(J) Energy Beam-polymerizable Compound:

When the photopolymerization initiator (E) is used, the adhesive layer may be blended with an energy beam-polymerizable compound (J). The adhesive layer can be reduced in an adhesive strength by curing the energy beam-polymerizable compound (J) together with the compound (B) by irradiation with an energy beam, and therefore interlayer peeling between the base material and the adhesive layer can readily be carried out.

The energy beam-polymerizable compound (J) is a compound which is polymerized and cured by irradiation with an energy beam such as a UV ray and an electron beam. Specific examples of the energy beam-polymerizable compound (J) include acrylate base compounds such as trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligo ester acrylate, urethane acrylate oligomers, epoxy-modified acrylate, polyether acrylate and itaconic acid oligomers. These compounds have at least one polymerizable double bond, and they have a weight average molecular weight of usually 100 to 30,000, preferably 300 to 10,000.

When using the energy beam-polymerizable compound (J), it is used in a proportion of usually 1 to 40 parts by weight, preferably 3 to 30 parts by weight and more preferably 3 to 20 parts by weight with respect to 100 parts by weight of the acrylic polymer (A). If it exceeds 40 parts by weight, the adhesiveness of the adhesive composition of the present invention to an organic substrate and a lead frame is reduced in a certain case.

Other Components:

The adhesive composition of the present invention may be blended, if necessary, with various additives in addition to the compounds described above. For example, a flexible component can be added in order to maintain the flexibility after cured. The flexible component is preferably a component which has flexibility at room temperature and under heating, and is not substantially cured by heating or irradiating with an energy beam. The flexible component may be a polymer comprising a thermoplastic resin or an elastomer or may be a graft component of a polymer or a block component of a polymer. Further, the flexible component may be modified in advance with an epoxy resin.

Further, a plasticizer, an antistatic agent, an antioxidant, a pigment, a dye and the like may be used as the various additives for the adhesive composition.

Adhesive Composition:

The adhesive composition comprising the respective components described above has an adhesiveness and a thermosetting property, and the composition in a non-cured state has a function of temporarily holding various adherends. It can provide finally a cured product having a high impact resistance through thermal curing, and in addition thereto, it is excellent in a balance between a shearing strength and a peeling strength and can maintain a satisfactory adhesive property even under a severe hot and humid condition.

The adhesive composition according to the present invention is obtained by mixing the respective components described above in suitable proportions. In mixing, the above components may be diluted in advance by a solvent or the solvent may be added in mixing.

Adhesive Sheet:

The adhesive sheet according to the present invention comprises a base material and, laminated thereon, an adhesive layer comprising the adhesive composition described above. The adhesive sheet according to the present invention can have all forms such as a tape form, a label form and the like.

Used as the base material for the adhesive sheet are, for example, transparent films such as a polyethylene film, a polypropylene film, a polybutene film, a polybutadiene film, a polymethylpentene film, a polyvinyl chloride film, a polyvinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene(meth)acrylic acid copolymer film, an ethylene(meth)acrylic ester copolymer film, a polystyrene film, a polycarbonate film, a polyimide film and the like. Also, cross-linked films thereof may be used as well. Further, laminated films thereof may be used. In addition to the transparent films described above, opaque films obtained by coloring the above films, fluororesin films and the like can be used. However, when the adhesive composition of the present invention is cured by an energy beam, the adhesive sheet of the present invention is irradiated with an energy beam such as UV ray from a base material side in a certain case, and therefore the base material is preferably transmittable to the energy beam used.

The adhesive sheet according to the present invention is adhered on various adherends, and after the adherends are subjected to required processing, the adhesive layer is peeled from the base material while firmly adhering and remaining on the adherend. That is, the adhesive sheet is used for a process including a step of transferring the adhesive layer from the base material onto the adherend. Accordingly, a face of the base material brought into contact with the adhesive layer has a surface tension of preferably 40 mN/m or less, more preferably 37 mN/m or less and particularly preferably 35 mN/m or less. The lower limit value is usually about 1 mN/m. The base material having such a low surface tension can be obtained by suitably selecting materials, and it can be obtained as well by subjecting the surface of the base material to peeling treatment by coating a releasing agent on it.

Releasing agents of an alkid base, a silicone base, a fluorine base, an unsaturated polyester base, a polyolefin base and a wax base are used as the releasing agent used for the peeling treatment of the base material. In particular, the releasing agents of an alkid base, a silicone base and a fluorine base are preferred since they have a heat resistance.

In order to subject the surface of the base material to peeling treatment with the releasing agent, the releasing agent without dissolving in a solvent or the releasing agent which is diluted or emulsified with a solvent is applied by means of a gravure coater, a Mayor bar coater, an air knife coater, a roll coater and the like and cured at room temperature or by heating or by irradiating with an electron beam, or a laminate is formed by wet lamination, dry lamination, hot melt lamination, melt extrusion lamination, coextrusion working and the like.

The base material has a film thickness of usually 10 to 500 µm, preferably 15 to 300 µm and particularly preferably 20 to 250 µm.

The adhesive layer has a thickness of usually 1 to 500 μm, preferably 5 to 300 μm and particularly preferably 10 to 150 μm.

A production process for the adhesive sheet shall not specifically be restricted, and it may be produced by coating the composition constituting the adhesive layer on a base material and drying it or may be produced by providing the adhesive layer on a releasing film and transferring it onto the base material. A releasing film may be laminated on an upper face of the adhesive layer in order to protect the adhesive layer before using the adhesive sheet. The adhesive layer may be applied by a method using known application devices such as a roll coater, knife coater, roll knife coater, die coater, and curtain coater.

Another adhesive layer and an adhesive tape may be separately provided at an outer circumferential part on the surface of the adhesive layer in order to fix jigs such as a ring frame and the like, which is used for fixing a wafer transitioninq from a dicing process to a die-bonding process, without allowing the adhesive layer to partially remain on the jigs.

(Method of Using the Adhesive Sheet)

Next, a use of the adhesive sheet according to the present invention shall be explained with reference to a case in which the above adhesive sheet is applied to production of a semiconductor device.

The first production process for a semiconductor device according to the present invention is characterized by comprising a step of adhering a semiconductor wafer on the adhesive layer of the adhesive sheet according to the present invention, dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer.

The second production process for a semiconductor device according to the present invention is characterized by comprising a step of adhering a semiconductor wafer on the adhesive layer containing the photopolymerization initiator (E) in the adhesive sheet according to the present invention, dicing the semiconductor wafer to prepare IC chips, separating the adhesive layer from the base material while firmly adhering the adhesive layer on a back face of the IC chip to allow it to remain thereon, and thermally bonding the IC chip on a die pad part through the adhesive layer and a step of irradiating the adhesive layer with an energy beam at any stage of after adhering the semiconductor wafer and before separating the IC chip.

In the first and second production processes for a semiconductor device according to the present invention, the adhesive sheet according to the present invention is fixed on a dicing equipment with a ring frame, and one face of a silicon wafer is placed on the adhesive layer of the adhesive sheet and slightly pressed to fix the wafer. Then, in the second production process for a semiconductor device according to the present invention, the adhesive layer is irradiated with an energy beam from a base material side to enhance a cohesion of the adhesive layer, whereby an adhesive strength between the adhesive layer and the base material is reduced. A ultraviolet ray (UV), an electron beam (EB) or the like is used as the energy beam irradiated, and a UV ray is preferably used.

Then, in both of the first and second production processes for a semiconductor device according to the present invention, the silicon wafer described above is cut by means of a cutting device such as a dicing saw and the like to obtain IC chips. In this case, the cut depth is a depth determined by adding the total of a thickness of the silicon wafer and a thickness of the adhesive layer and an abraded part of the dicing saw.

In the second production process for a semiconductor device according to the present invention, irradiation with an energy beam may be carried out at any stage of after adhering the semiconductor wafer and before separating the IC chip, and it may be carried out, for example, after dicing or may be carried out after an expanding step described below. Further, irradiation with an energy beam may be carried out dividing into plural times.

Then, in both of the first and second production processes for a semiconductor device according to the present invention, expanding of the adhesive sheet carried out if necessary makes it possible to enlarge an interval between the IC chips and further readily carry out picking-up of the IC chip. In this case, deviation is caused between the adhesive layer and the base material, and an adhesive strength between the adhesive layer and the base material is reduced, so that a picking-up property of the chip is enhanced.

Picking-up of the IC chip carried out in the manner described above makes it possible to separate the adhesive layer from the base material while firmly adhering the cut adhesive layer on a back face of the IC chip to allow it to remain thereon.

Then, the IC chip is mounted on a die pad part through the adhesive layer. The die pad part is heated before mounting the IC chip or immediately after mounting. The heating temperature is usually 80 to 200° C., preferably 100 to 180° C. The heating time is usually 0.1 seconds to 5 minutes, preferably 0.5 seconds to 3 minutes, and the chip mounting pressure is usually 1 kPa to 200 MPa.

After the IC chip is chip-mounted on the die pad part, it may be further heated if necessary. In this case, the heating condition falls in the range of the heating temperature described above, and the heating time is usually 1 to 180 minutes, preferably 10 to 120 minutes.

The IC chip may stay in a temporary adhesion state without carrying out heat treatment after chip-mounting, and the adhesive layer may be cured by making use of heating in sealing the resin carried out at an after-step.

The adhesive layer is cured by passing through the above steps, and the IC chip can firmly be adhered onto the die pad part. The adhesive layer is fluidized under a die bonding condition, and therefore it is sufficiently embedded into irregularities of the die pad part and can prevent voids from being produced.

That is, in the mounted product obtained, the adhesive which is a firmly adhering means for the chip is cured and is sufficiently embedded into the irregularities of the die pad part, and therefore the satisfactory package reliability and board mounting property are achieved even under severe conditions.

The adhesive composition and the adhesive sheet according to the present invention can be used as well for adhering semiconductor compounds, glass, ceramics, metals and the like in addition to the applications described above.

EXAMPLES

Hereinbelow, the present invention shall be explained in detail with reference to examples, but the present invention shall not be restricted to these examples.

In the following examples and comparative examples, "evaluation of a surface mounting property" was carried out in the following manner.

Evaluation of Surface Mounting Property
(1) Production of Semiconductor Chip

Adhesive sheets prepared in the examples and the comparative examples were adhered on a ground surface of a #2000 ground silicon wafer (150 mm diameter and thickness 150 μm) by means of a tape mounter (Adwill RAD2500, manufactured by Lintec Corporation), and the wafer was fixed at a ring frame for wafer dicing. When the adhesive composition contained a photopolymerization initiator, the adhesive composition was then irradiated (350 mW/cm$^2$, 190 mJ/cm$^2$) with a UV ray from the base material side by means of a UV ray irradiating equipment (Adwill RAD2000, manufactured by Lintec Corporation).

Then, the wafer was diced into a chip size of 8 mm×8 mm by means of a dicing equipment (AWD-4000B, manufactured by Tokyo Seimitsu Co., Ltd.). A cut amount in dicing was such that the base material was cut into by 20 μm.

(2) Production of Semiconductor Package

Used as a substrate was a BT substrate (manufactured by Chino Giken Co., Ltd.) in which circuit paterns were formed at a copper foil of a copper foil-clad laminate (CCL-HL830, manufactured by Mitsubishi Gas Chemical Co., Inc.) and in which a solder resist (PSR4000 AUS5, manufactured by Taiyo Ink Mfg. Co., Ltd.) was provided on the patterns in a thickness of 40 μm. The chip obtained in (1) described above on the adhesive sheet was taken up from the base material together with the adhesive layer, and it was pressed and bonded on the BT substrate through the adhesive layer on the conditions of 120° C., 100 gf and 1 second. Then, the BT substrate was sealed with a mold resin (KE-1100AS3, manufactured by KYOCERA Chemical Corporation) so that a sealing thickness was 400 μm (sealing equipment: MPC-06M Trial Press, manufactured by APIC YAMADA CORPORATION), and the mold resin was cured at 175° C. for 5 hours. Then, the BT substrate sealed was adhered on a dicing tape (Adwill D-510T, manufactured by Lintec Corporation) and diced into a size of 12 mm x 12 mm by means of the dicing equipment (DFD651, manufactured by DISCO CORPORATION), whereby a semiconductor package for evaluating reliability was obtained.

(3) Evaluation of Surface Mounting Property of Semiconductor Package

The semiconductor package obtained was left standing for 168 hours under the condition of 85° C. and 60% RH and allowed to absorb moisture, and then IR reflow (reflow furnace: WL-15-20DNX, manufactured by Sagami-Rikou Co., Ltd.) was carried out three times at a maximum temperature of 260° C. and a heating time of 1 minute to evaluate the presence of floating and peeling at the adhered part and the presence of cracks produced in the package by means of a scanning type ultrasonic flaw detector (Hye-Focus, manufactured by Hitachi Kenki Fine Tech and Co., Ltd.) and observation of the cross-section.

A case in which peeling of 0.5 mm or more was observed at the adhered part of the semiconductor chip and the substrate was judged as peeling, and 25 pieces of the packages were subjected to the test to count the number of the packages which did not bring about peeling.

The adhesive composition was constituted by the following components.

(A) Acrylic polymer: Coponyl N-4617, manufactured by The Nippon Synthetic Chemical Industry Co., Ltd.

(B) Epoxy thermosetting resin having an unsaturated hydrocarbon group:

(B)-1: Acryroyl group-added bisphenol A epoxy resin (Shiko UT-4226, manufactured by Nippon Synthetic Chemical Industry Co., Ltd., epoxy equivalent: 457 q/eq, number average molecular weight: 642, content of unsaturated group: equal to content of epoxy group)

(B)-2: Acryroyl group-added bisphenol A epoxy resin (ZAA-278, manufactured by Nippon Kayaku Co., Ltd., epoxy equivalent: 675 g/eq, number average molecular weight: 1,800, content of unsaturated group: equal to content of epoxy group)

(B)-3: Acryroyl group-added cresol novolak epoxy resin (CNN-147, manufactured by Nippon Kayaku Co., Ltd., epoxy equivalent: 518 g/eq, number average molecular weight: 2,100, content of unsaturated group: equal to content of epoxy group)

(C) Bisphenol A type epoxy resin (Epicoat 828, epoxy equivalent: 189 g/eq, manufactured by Japan Epoxy Resins Co., Ltd.)

(D) Themosetting agent:

(D)-1: Novolak type phenol resin (Shonol BRG-556, phenolic hydroxyl equivalent: 104 g/eq, manufactured by Showa Highpolymer Co., Ltd.)

(D)-2: Xylok phenol resin (Milex XLC-4L, manufactured by Mitsui Chemicals Inc.)

(E) Photopolymerization initiator (Irgacure 184, manufactured by Ciba Specialty Chemicals K. K.)

(F) Curing accelerating agent: imidazole (Curezol 2PHZ, manufactured by Shikoku Chemicals Corporation)

(G) Silane coupling agent (MKC Silicate MSEP2, manufactured by Mitsubishi Chemical Corporation)

(H) Cross-linking agent: aromatic polyisocyanate (Coronate L, manufactured by Nippon Polyurethane Industry Co., Ltd.)

(I) Inorganic filler: silica (ADMAFINE SC2050, manufactured by Admatechs Co., Ltd.)

(J) Energy beam-polymerizable compound: dipentaerythritol hexaacrylate (Kayarad DPHA, manufactured by Nippon Kayaku Co., Ltd.)

A polyethylene film (thickness: 100 μm, surface tension: 33 mN/m) was used as a base material for the adhesive sheet.

EXAMPLES AND COMPARATIVE EXAMPLES

Adhesive compositions having compositions shown in Tables 1 and 2 were used. In the table, numerical values show parts by weight in terms of a solid content. The adhesive compositions having the compositions shown in Tables 1 and 2 were applied on a release film (SP-PET3811 (S), manufactured by Lintec Corporation) subjected to silicone treatment so that a film thickness after drying was 30 μm, dried (drying conditions: 100° C., one minute in an oven) and then stuck onto a base material to transfer the adhesive layer on the base material, whereby adhesive sheets were obtained.

The adhesive sheets thus obtained were used to evaluate a surface mounting property. The results thereof are shown in Table 3.

TABLE 1

| Component | Example | | | | | | | | |
| --- | --- | --- | --- | --- | --- | --- | --- | --- | --- |
|  | 1 | 2 | 3 | 4 | 5 | 6 | 7 | 8 | 9 |
| A | 100 | 100 | 100 | 100 | 100 | 100 | 100 | 100 | 100 |
| B-1 | 8.1 | 24.3 | 81.0 | 24.3 | 22.0 |  |  | 15.0 | 8.1 |
| B-2 |  |  |  |  |  | 26.0 |  |  |  |

TABLE 1-continued

| Component | | | | | | | | | |
|---|---|---|---|---|---|---|---|---|---|
| B-3 | | | | | | 25.0 | | | |
| C | | | | | | | | 7.5 | |
| D-1 | 1.9 | 5.7 | 19.0 | 5.7 | | 4.0 | 5.0 | 7.5 | 1.9 |
| D-2 | | | | | 8.0 | | | | |
| E | | | | | | | | | 0.2 |
| F | 0.08 | 0.24 | 0.81 | 0.24 | 0.22 | 0.26 | 0.25 | 0.23 | 0.08 |
| G | 0.7 | 0.7 | 0.7 | 0.7 | 0.7 | 0.7 | 0.7 | 0.7 | 0.7 |
| H | 1.5 | 1.5 | 1.5 | 1.5 | 1.5 | 1.5 | 1.5 | 1.5 | 1.5 |
| I | | | | | 10 | | | | |
| J | | | | | | | | | |

| | Example | | | | | | | |
|---|---|---|---|---|---|---|---|---|
| Component | 10 | 11 | 12 | 13 | 14 | 15 | 16 | 17 |
| A | 100 | 100 | 100 | 100 | 100 | 100 | 100 | 100 |
| B-1 | 24.3 | 81.0 | 24.3 | 22.0 | | | 15.0 | 24.3 |
| B-2 | | | | | 26.0 | | | |
| B-3 | | | | | | 25.0 | | |
| C | | | | | | | 7.5 | |
| D-1 | 5.7 | 19.0 | 5.7 | | 4.0 | 5.0 | 7.5 | 5.7 |
| D-2 | | | | 8.0 | | | | |
| E | 0.7 | 2.4 | 0.7 | 0.7 | 0.7 | 0.7 | 0.5 | 0.9 |
| F | 0.24 | 0.81 | 0.24 | 0.22 | 0.26 | 0.25 | 0.23 | 0.24 |
| G | 0.7 | 0.7 | 0.7 | 0.7 | 0.7 | 0.7 | 0.7 | 0.7 |
| H | 1.5 | 1.5 | 1.5 | 1.5 | 1.5 | 1.5 | 1.5 | 1.5 |
| I | | | 10 | | | | | |
| J | | | | | | | | 5 |

Unit: parts by weight (value reduced to a solid content)

TABLE 2

| | Comparative Examples | | | | | |
|---|---|---|---|---|---|---|
| Component | 1 | 2 | 3 | 4 | 5 | 6 |
| A | 100 | 100 | 100 | 100 | 100 | 100 |
| B-1 | | | | | | |
| B-2 | | | | | | |
| B-3 | | | | | | |
| C | 6.5 | 19.5 | 97.5 | 19.5 | 10.6 | 19.5 |
| D-1 | 3.5 | 10.5 | 52.5 | 10.5 | | 10.5 |
| D-2 | | | | | 9.4 | |
| E | | | | | | 0.2 |
| F | 0.07 | 0.20 | 0.98 | 0.20 | 0.10 | 0.20 |
| G | 0.7 | 0.7 | 0.7 | 0.7 | 0.7 | 0.7 |
| H | 1.5 | 1.5 | 1.5 | 1.5 | 1.5 | 1.5 |
| I | | | | 10 | | 10 |
| J | | | | | | 5 |

Unit: parts by weight (value reduced to a solid content)

TABLE 3

| | Evaluation results of surface mounting property(*) |
|---|---|
| Example 1 | 25/25 |
| Example 2 | 25/25 |
| Example 3 | 25/25 |
| Example 4 | 25/25 |
| Example 5 | 25/25 |
| Example 6 | 25/25 |
| Example 7 | 25/25 |
| Example 8 | 25/25 |
| Example 9 | 25/25 |
| Example 10 | 25/25 |
| Example 11 | 25/25 |
| Example 12 | 25/25 |
| Example 13 | 25/25 |
| Example 14 | 25/25 |
| Example 15 | 25/25 |
| Example 16 | 25/25 |
| Example 17 | 25/25 |
| Comparative example 1 | 5/25 |
| Comparative example 2 | 7/25 |
| Comparative example 3 | 3/25 |
| Comparative example 4 | 3/25 |
| Comparative example 5 | 0/25 |
| Comparative example 6 | 0/25 |

(*)number of the packages which did not cause floating and peeling at the adhered part and did not have package cracks/number of the packages subjected to the test According to the present invention, provided are an adhesive composition which can achieve a high package reliability even when exposed to severe reflow conditions in a package in which a semiconductor chip being reduced in a thickness is mounted, an adhesive sheet having an adhesive layer comprising the above adhesive composition and a production process for a semiconductor device using the above adhesive sheet.

What is claimed is:

1. An adhesive composition consisting of an acrylic polymer, an epoxy thermosetting resin having an unsaturated hydrocarbon group, a thermosetting agent, a photopolymerization initiator, an energy beam-polymerizable compound, and optionally one or more other component(s), wherein the unsaturated hydrocarbon group is selected from the group consisting of an acryloyl group and a methacryloyl group, the thermosetting agent is selected from (i) at least one of the resins represented by Formulas (7), (8), and (9), and (ii) optionally the resin represented by Formula (10), in each case as described as follows, a novolak phenol resin represented by the following Formula (7), (7)

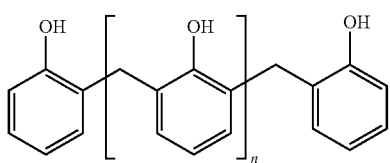

wherein n represents an integer of 0 or more,
a dicyclopentadiene phenol resin represented by the following Formula (8), (8)

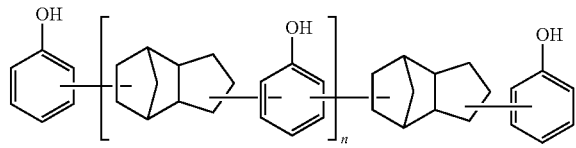

wherein n represents an integer of 0 or more,
a multifunctional phenol resin represented by the following Formula (9), (9)

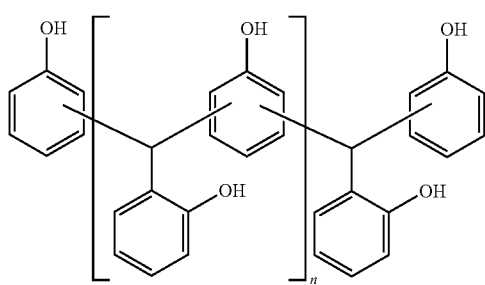

wherein n represents an integer of 0 or more,
a xylok phenol resin represented by the following Formula (10), (10)

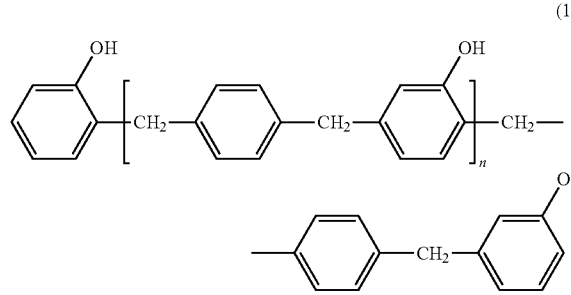

wherein n represents an integer of 0 or more, and
further wherein the other component(s) are selected from the group consisting of at least one of a curing accelerating agent, a coupling agent, a cross-linking agent, an inorganic filler, a flexible component, a plasticizer, an antistatic agent, an antioxidant, a pigment, a dye, a solvent, and an epoxy thermosetting resin selected from the group consisting of, a bishpenol A diglycidyl ether and hydrogenated compounds thereof,
an ortho-cresol novolak epoxy resin represented by the following formula (3):

(3)

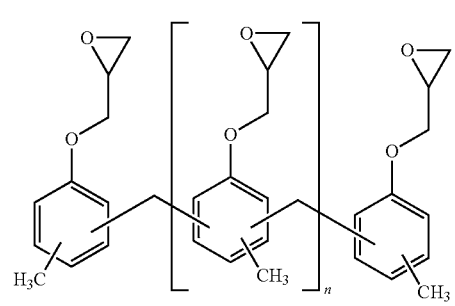

wherein n represents an integer of 0 or more,
a dicyclopentadiene epoxy resin represented by the following formula (4):

(4)

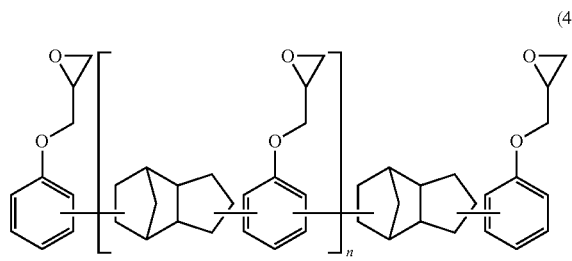

wherein n represents an integer of 0 or more, and
a biphenyl epoxy resin or a biphenyl compound represented by the following Formula (5) or (6), (5)

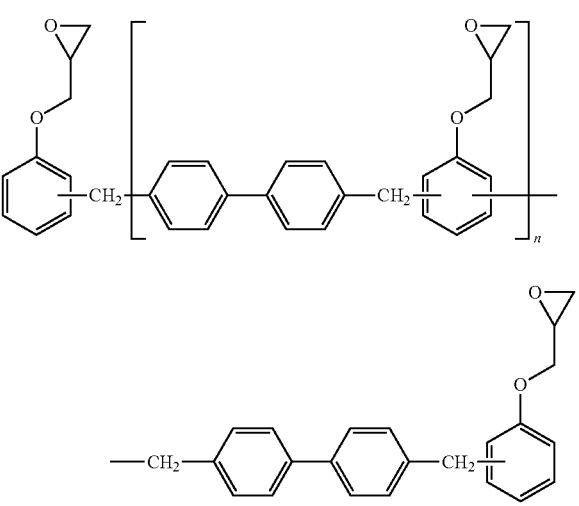

wherein n represents an integer of 0 or more,

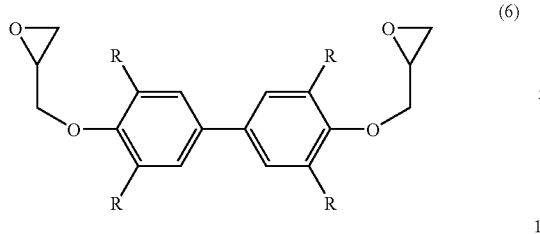

(6)

wherein R represents a hydrogen atom or a methyl group.

2. The adhesive composition according to claim 1, wherein the epoxy thermosetting resin having an unsaturated hydrocarbon group is a resin having an aromatic ring.

3. The adhesive composition of claim 1, wherein the epoxy thermosetting resin having an unsaturated hydrocarbon group is selected from the group consisting of:

a compound represented by the following formula (1):

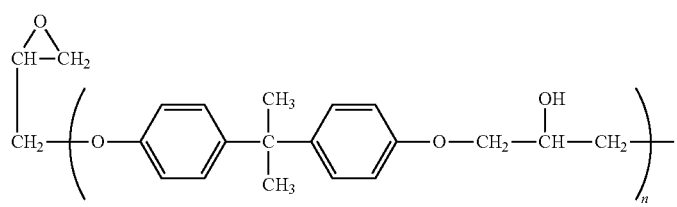

(1)

wherein R is H— or $CH_3$—, and n is an integer of 0 to 10;

a compound represented by the following formula (2):

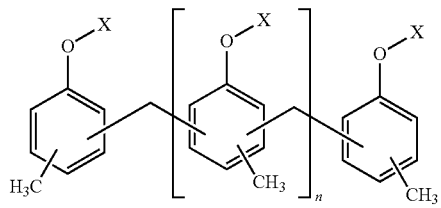

(2)

wherein X is

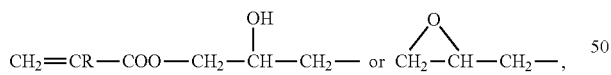

R is H— or $CH_3$—, and n is an integer of 0 to 10, provided that some X groups are

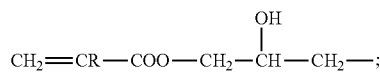

and a compound obtained through the addition reaction of acrylic acid to some epoxy groups of an epoxy thermosetting resin selected from the group consisting of:

a bisphenol A diglycidyl ether and hydrogenated compounds thereof, an ortho-cresol novolak epoxy resin represented by the following formula (3):

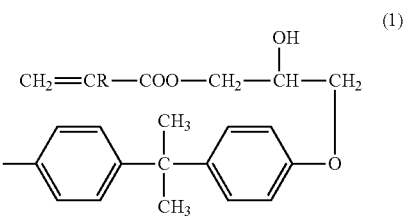

(3)

wherein n represents an integer of 0 or more, a dicyclopentadiene epoxy resin represented by the following formula (4):

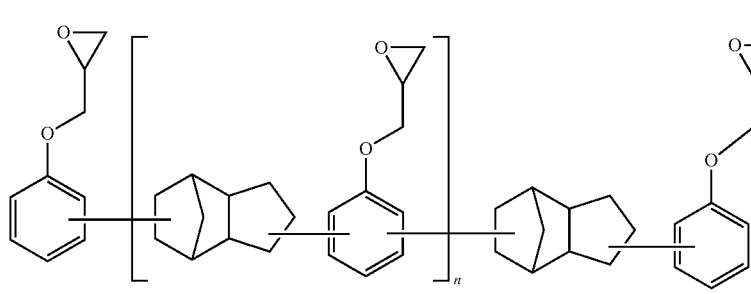

(4)

wherein n represents an integer of 0 or more,
a biphenyl epoxy resin represented by the following formula (5):

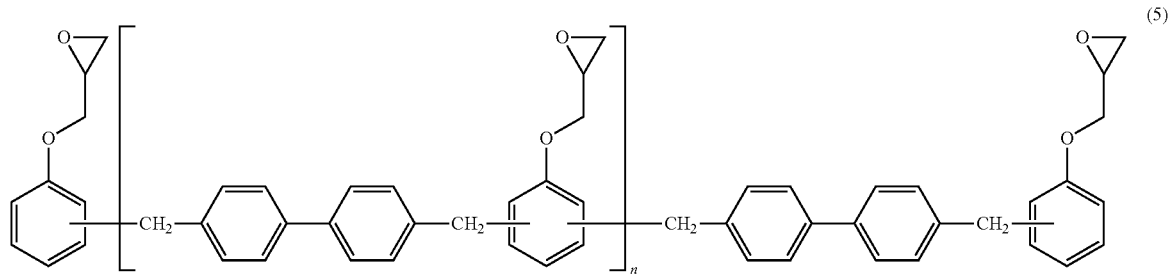

wherein n represents an integer of 0 or more, and
a biphenyl compound represented by the following formula (6):

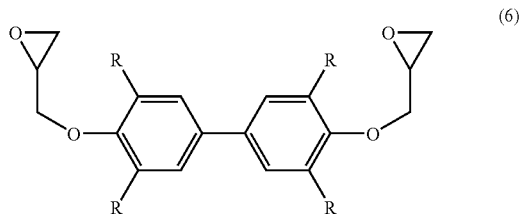

wherein R represents a hydrogen atom or a methyl group.

4. The adhesive composition according to claim 1, wherein the thermosetting agent is selected from (i) the resin represented by Formula (7), and (ii) optionally at least one of the resins represented by Formulas (8), (9), and (10).

5. The adhesive composition according to claim 1, wherein the thermosetting agent is selected from (i) the resin represented by Formula (8), and (ii) optionally at least one of the resins represented by Formulas (7), (9), and (10).

6. The adhesive composition according to claim 1, wherein the thermosetting agent is selected from (i) the resin represented by Formula (9), and (ii) optionally at least one of the resins represented by Formulas (7), (8), and (10).

7. The adhesive composition according to claim 1, wherein the epoxy thermosetting resin having an unsaturated hydrocarbon group comprises, (A) a compound obtained through the addition reaction of acrylic acid to some epoxy groups of an epoxy thermosetting resin selected from the group consisting of, a dicyclopentadiene epoxy resin represented by the following formula (4):

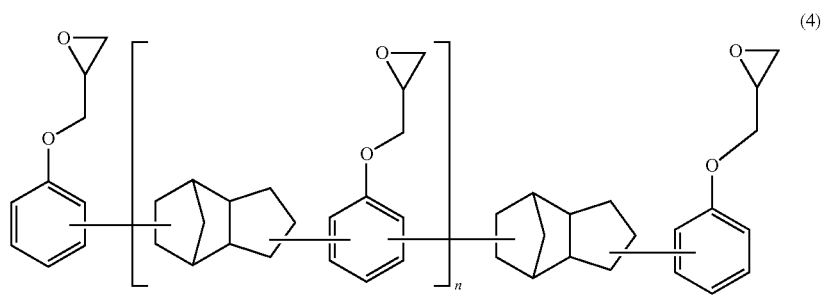

wherein n represents an integer of 0 or more,
a biphenyl epoxy resin represented by the following formula (5):

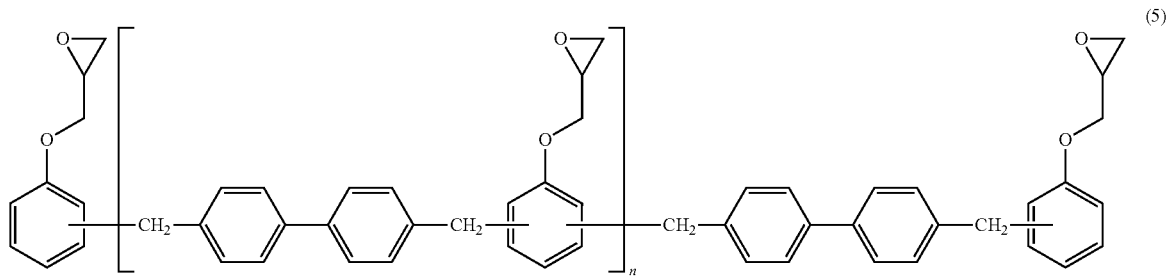

wherein n represents an integer of 0 or more, and
a biphenyl compound represented by the following formula (6):

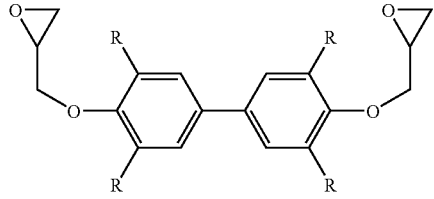
(6)

wherein R represents a hydrogen atom or a methyl group; and
(B) optionally at least one of,
a compound represented by the following formula (1):

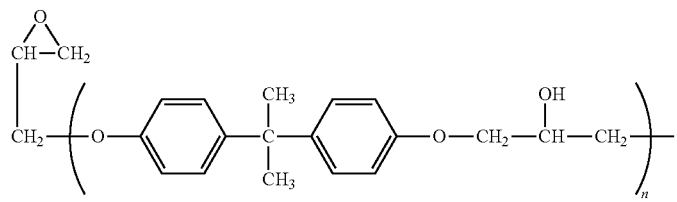
(1)

wherein R is H— or CH$_3$—, and n is an integer of 0 to 10;
a compound represented by the following formula (2):

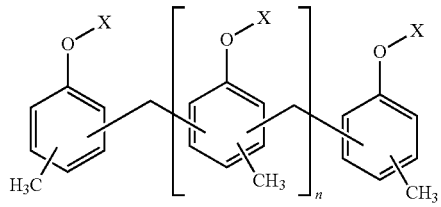
(2)

wherein X is

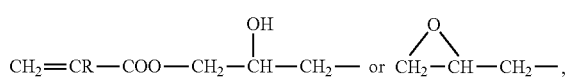

R is H— or CH$_3$—, and n is an integer of 0 to 10, provided that some X groups are

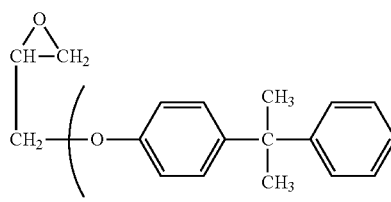

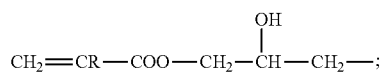

and
a compound obtained through the addition reaction of acrylic acid to some epoxy groups of an epoxy thermosetting resin selected from the group consisting of, a bisphenol A diglycidyl ether and hydrogenated compounds thereof, and an ortho-cresol novolak epoxy resin represented by the following formula (3):

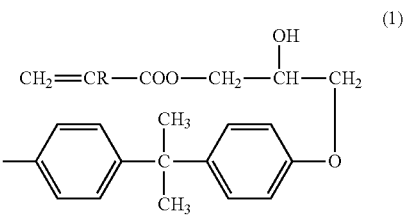
(3)

wherein n represents an integer of 0 or more.

8. An adhesive sheet comprising a base material and, formed thereon, an adhesive layer comprising the adhesive composition of claim 1.

9. The adhesive sheet of claim 5 wherein the epoxy thermosetting resin having an unsaturated hydrocarbon group is a resin having an aromatic ring.

10. The adhesive sheet according to claim 8, wherein the epoxy thermosetting resin having an unsaturated hydrocarbon group is selected from the group consisting of:
a compound represented by the following formula (1):

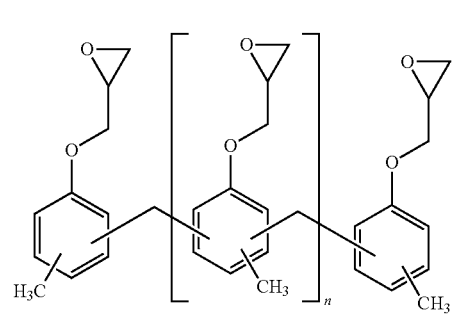
(1)

wherein R is H— or CH$_3$—, and n is an integer of 0 to 10;

a compound represented by the following formula (2):

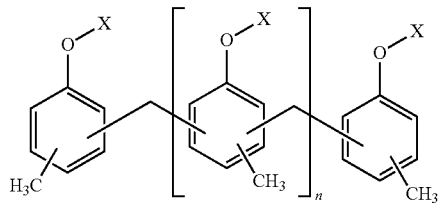

wherein X is

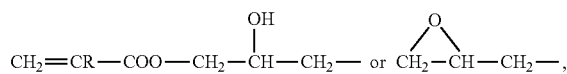

R is H— or CH$_3$—, and n is an integer of 0 to 10, provided that some X groups are

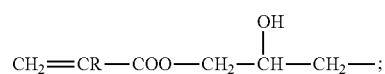

and a compound obtained through the addition reaction of acrylic acid to some epoxy groups of an epoxy thermosetting resin selected from the group consisting of:

a bisphenol A diglycidyl ether and hydrogenated compounds thereof, an ortho-cresol novolak epoxy resin represented by the following formula (3):

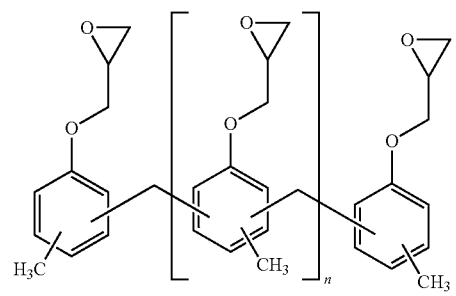

wherein n represents an integer of 0 or more, a dicyclopentadiene epoxy resin represented by the following formula (4):

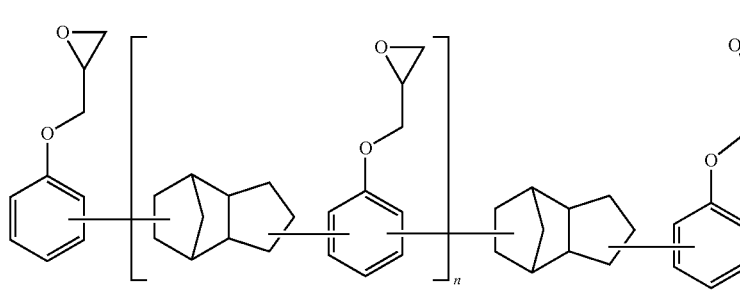

wherein n represents an integer of 0 or more, a biphenyl epoxy resin represented by the following formula (5):

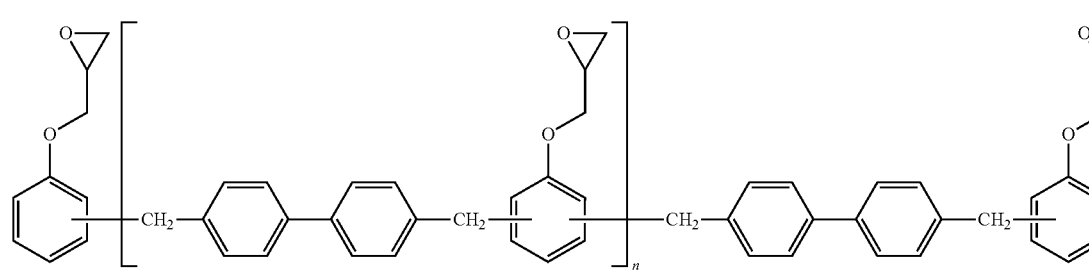

wherein n represents an integer of 0 or more, and a biphenyl compound represented by the following formula (6):

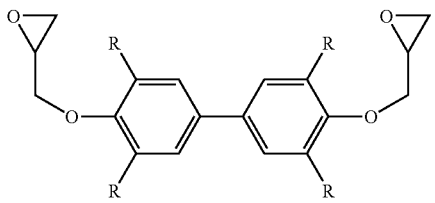

(6)

wherein R represents a hydrogen atom or a ethyl group.

11. The adhesive sheet according to claim 8, wherein the thermosetting agent is selected from (i) the resin represented by Formula (7), and (ii) optionally at least one of the resins represented by Formulas (8), (9), and (10).

12. The adhesive sheet according to claim 8, wherein the thermosetting agent is selected from (i) the resin represented by Formula (8), and (ii) optionally at least one of the resins represented by Folinulas (7), (9), and (10).

13. The adhesive sheet according to claim 8, wherein the thermosetting agent is selected from (i) the resin represented by Formula (9), and (ii) optionally at least one of the resins represented by Formulas (7), (8), and (10).

14. The adhesive sheet according to claim 8, wherein the epoxy thermosetting resin having an unsaturated hydrocarbon group comprises, (A) a compound obtained through the addition reaction of acrylic acid to some epoxy groups of an epoxy thermosetting resin selected from the group consisting of,
a dicyclopentadiene epoxy resin represented by the following formula (4):

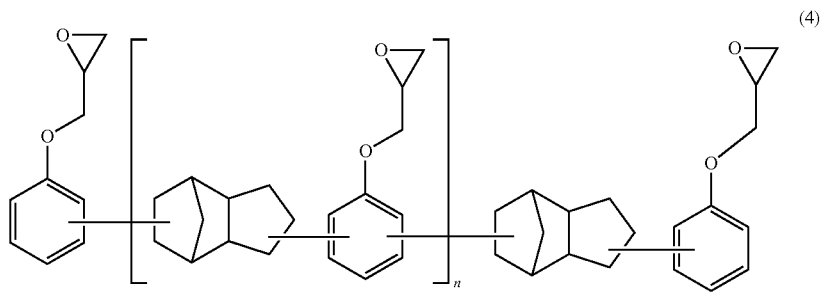

(4)

wherein n represents an integer of 0 or more,
a biphenyl epoxy resin represented by the following formula (5):

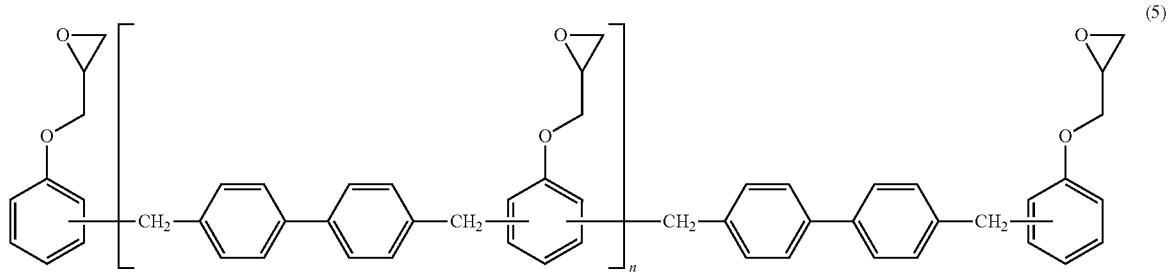

(5)

wherein n represents an integer of 0 or more, and
a biphenyl compound represented by the following formula (6):

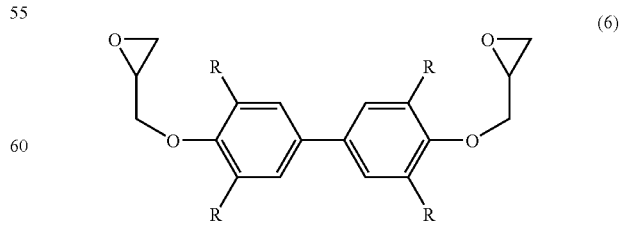

(6)

wherein R represents a hydrogen atom or a methyl group; and (B) optionally at least one of,
a compound represented by the following formula (1):

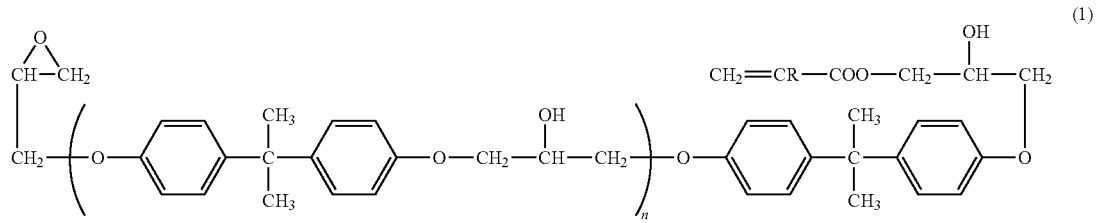

wherein R is H— or CH3—, and n is an integer of 0 to 10;
a compound represented by the following formula (2):

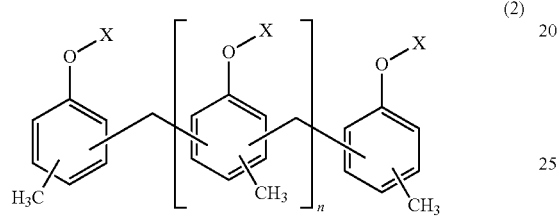

wherein X is

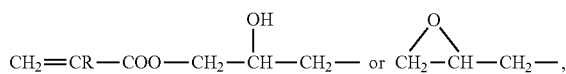

R is H— or $CH_3$—, and n is an integer of 0 to 10, provided that some X groups are

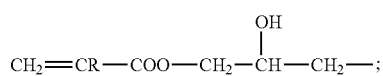

and a compound obtained through the addition reaction of acrylic acid to some epoxy groups of an epoxy thermosetting resin selected from the group consisting of, a bisphenol A diglycidyl ether and hydrogenated compounds thereof, and an ortho-cresol novolak epoxy resin represented by the following formula (3):

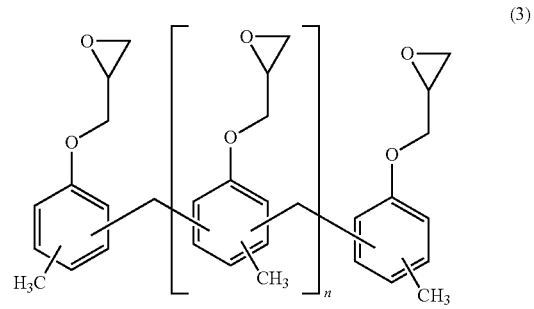

wherein n represents an integer of 0 or more.

* * * * *

UNITED STATES PATENT AND TRADEMARK OFFICE
CERTIFICATE OF CORRECTION

PATENT NO. : 9,184,082 B2  Page 1 of 2
APPLICATION NO. : 11/945769
DATED : November 10, 2015
INVENTOR(S) : Naoya Saiki et al.

It is certified that error appears in the above-identified patent and that said Letters Patent is hereby corrected as shown below:

In The Claims

Column 20, Line 1, Claim 1, delete "bishpenol" and insert -- bisphenol --

Column 20, Lines 45-65, Claim 1, delete

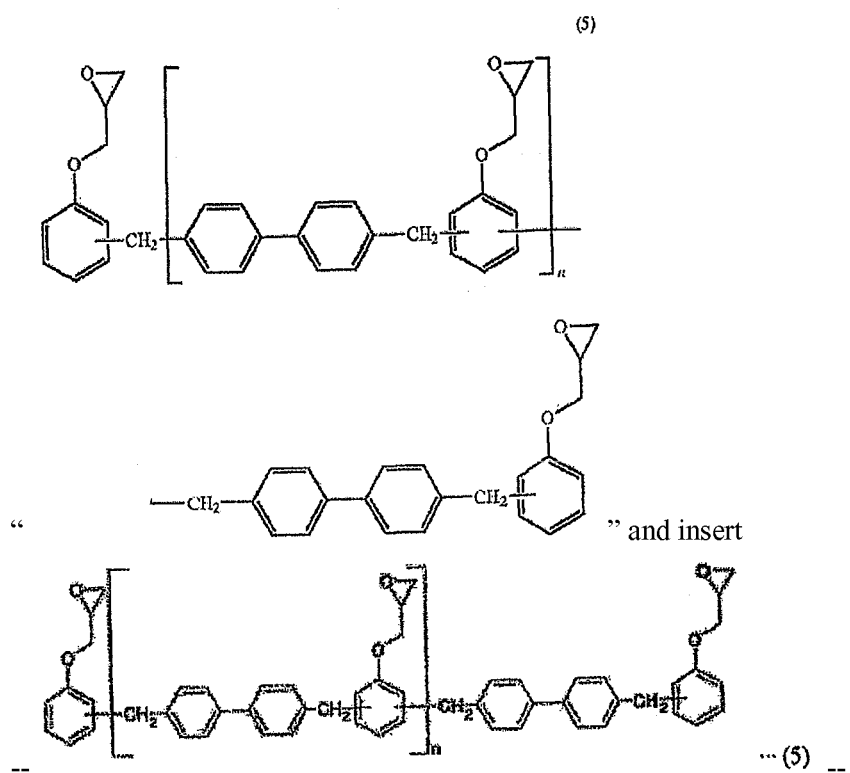

Column 26, Line 48, Claim 9, delete "claim 5" and insert -- claim 8 --

Column 29, Line 15, Claim 10, delete "ethyl" and insert -- methyl --

Signed and Sealed this
Twelfth Day of April, 2016

Michelle K. Lee
*Director of the United States Patent and Trademark Office*

CERTIFICATE OF CORRECTION (continued)
U.S. Pat. No. 9,184,082 B2

Column 30, Line 6, Claim 12, delete "Folinulas" and insert -- Formulas --

Column 31, Line 15, Claim 14, delete "CH3—," and insert -- $CH_3$—, --